US012162045B2

(12) United States Patent
Chao et al.

(10) Patent No.: US 12,162,045 B2
(45) Date of Patent: Dec. 10, 2024

(54) WAFER WET CLEANING SYSTEM (71) Applicant: Taiwan Semiconductor Manufacturing Co., Ltd., Hsinchu (TW)

(72) Inventors: Chih-Wei Chao, Hsinchu (TW); Shu-Yen Wang, Taipei (TW)

(73) Assignee: Tawain Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/521,187

(22) Filed: Jul. 24, 2019

(65) Prior Publication Data

US 2020/0094293 A1 Mar. 26, 2020

Related U.S. Application Data (60) Provisional application No. 62/736,744, filed on Sep. 26, 2018.

(51) Int. Cl.
*B08B 3/08* (2006.01)
*B08B 3/10* (2006.01)
*H01L 21/02* (2006.01)
*H01L 21/67* (2006.01)

(52) U.S. Cl.
CPC .............. *B08B 3/08* (2013.01); *B08B 3/10* (2013.01); *H01L 21/02057* (2013.01); *H01L 21/67051* (2013.01); *B08B 2203/007* (2013.01)

(58) Field of Classification Search
None
See application file for complete search history.

(56) References Cited

U.S. PATENT DOCUMENTS

| | | | |
|---|---|---|---|
| 2003/0077903 A1* | 4/2003 | Andreas | H01L 21/02063 438/687 |
| 2003/0132193 A1 | 7/2003 | Okamoto | |
| 2004/0206374 A1 | 10/2004 | Dinesh et al. | |
| 2004/0255978 A1* | 12/2004 | Fury | B01D 11/0203 134/113 |
| 2005/0016929 A1* | 1/2005 | Kashkoush | C02F 9/005 210/739 |

(Continued)

FOREIGN PATENT DOCUMENTS

| | | | | |
|---|---|---|---|---|
| EP | 1084402 B1 * | 2/2002 | ....... | H01L 21/67253 |
| JP | 2002270568 A | 9/2002 | | |

*Primary Examiner* — Natasha N Campbell
*Assistant Examiner* — Pradhuman Parihar
(74) *Attorney, Agent, or Firm* — Sterne, Kessler, Goldstein & Fox P.L.L.C.

(57) ABSTRACT

The present disclosure describes a wafer cleaning process in which a drained cleaning solution, which is used to remove metal contaminants from the wafer, is sampled and analyzed to determine the concentration of metal ions in the solution. The wafer cleaning process includes dispensing, in a wafer cleaning station, a chemical solution on one or more waters; collecting the dispensed chemical solution; determining a concentration of contaminants in the chemical solution; in response to the concentration of the contaminants being greater than a baseline value, adjusting one or more parameters in the cleaning process; and in response to the concentration of the contaminants being equal to or less than the baseline value, transferring the one or more wafers out of the wafer cleaning station.

20 Claims, 3 Drawing Sheets

(56) References Cited

U.S. PATENT DOCUMENTS

| | | |
|---|---|---|
| 2012/0009690 A1 | 1/2012 | Wann et al. |
| 2014/0190937 A1 | 7/2014 | Tan |
| 2014/0305471 A1 | 10/2014 | Kashkoush et al. |
| 2014/0377463 A1* | 12/2014 | Hachiya ................ B05D 3/107 427/337 |
| 2015/0069575 A1* | 3/2015 | Teraguchi ........... H01L 29/7786 118/733 |
| 2017/0221987 A1 | 8/2017 | Konrath |
| 2019/0362962 A1* | 11/2019 | Chao ................ H01L 21/67057 |

* cited by examiner

WAFER WET CLEANING SYSTEM

CROSS-REFERENCE TO RELATED APPLICATION

This application claims the benefit of U.S. Provisional Patent Application No. 62/736,744, titled "Wafer Wet Cleaning System," which was filed on Sep. 26, 2018 and is incorporated herein by reference in its entirety.

BACKGROUND

Production equipment used in semiconductor manufacturing can be a source of unwanted particles for semiconductor wafers in an integrated circuit (IC) fabrication facility. During the wafer fabrication process, the semiconductor wafers undergo numerous processing operations. The number of unwanted particles on the wafer's surface can increase during IC fabrication as the wafer is exposed to additional processing, thus adversely affecting wafer yield and IC performance.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

Wafer cleaning is a process to remove contamination introduced during the semiconductor fabrication process. The contamination can include organics (e.g., organic byproducts), metallics (traces of metals), and native oxides. Wafer cleaning methods include dry cleaning methods, wet cleaning methods, or combinations thereof.

Wet cleaning can be performed in wet tools, which can handle either batches of wafers (e.g., in a bath) or a single wafer at a time (e.g., "single-wafer" tools). For example, in a single-wafer tool, the wafer enters a cleaning module and is positioned on a wafer stage. The wafer is then subjected to a wet cleaning via one or more nozzles positioned above the wafer's surface. The one or more nozzles can flow chemicals (e.g., a chemical solution, deionized water, etc.) under pressure on the wafer's surface to remove contamination. After the cleaning process, the wafer can be dried (e.g., via spinning) and released from the wet cleaning tool.

One or more wafers can be randomly selected to be screened for contaminants and particles to assess the efficiency of the wet cleaning process. The contaminants can be (i) any unwanted particles, organics, metallics, or native oxides on the wafer's surface that endured the wet cleaning process or (ii) chemical traces from the wet cleaning solutions used in the wet cleaning and drying processing (e.g., water spots, acids, derivatives of ammonia, etc.).

If the contamination levels are still elevated compared to a baseline level, the wafer can be "re-worked" (e.g., subjected to additional cleaning in the wet tool) or discarded. The aforementioned process can be both time consuming and costly because the contamination level is not measured concurrently (e.g., in real time) with the wet cleaning process—for example, the sampling process described above requires that the wafer is removed from the wet cleaning tool after the wet cleaning process, measured on a different tool (e.g., possibly transported to a different location of the fabrication facility), and then returned to the wet cleaning tool for additional cleaning, if necessary. This wafer contamination analysis can take a substantial amount of time (e.g., one or more hours), thus impacting overall chip production throughput.

This disclosure is directed to a wafer cleaning process that collects and analyzes (e.g., in real-time) the "consumed" wet etch chemistry during a wafer cleaning process to determine and monitor each wafer's contamination levels during the cleaning operation. If the analyzed data shows that the contamination levels are elevated compared to a baseline level, the parameters of the wet cleaning process can be adjusted (e.g., in real time). On the other hand, if the analyzed data shows that the contamination levels are within the baseline levels, the wafer can be dried and removed from the wet cleaning tool. Additionally, this method can be used to reduce the cleaning process time for incoming wafers whose contamination levels are low (e.g., below a baseline level) and may require a shorter wet cleaning process.

Figure 1:
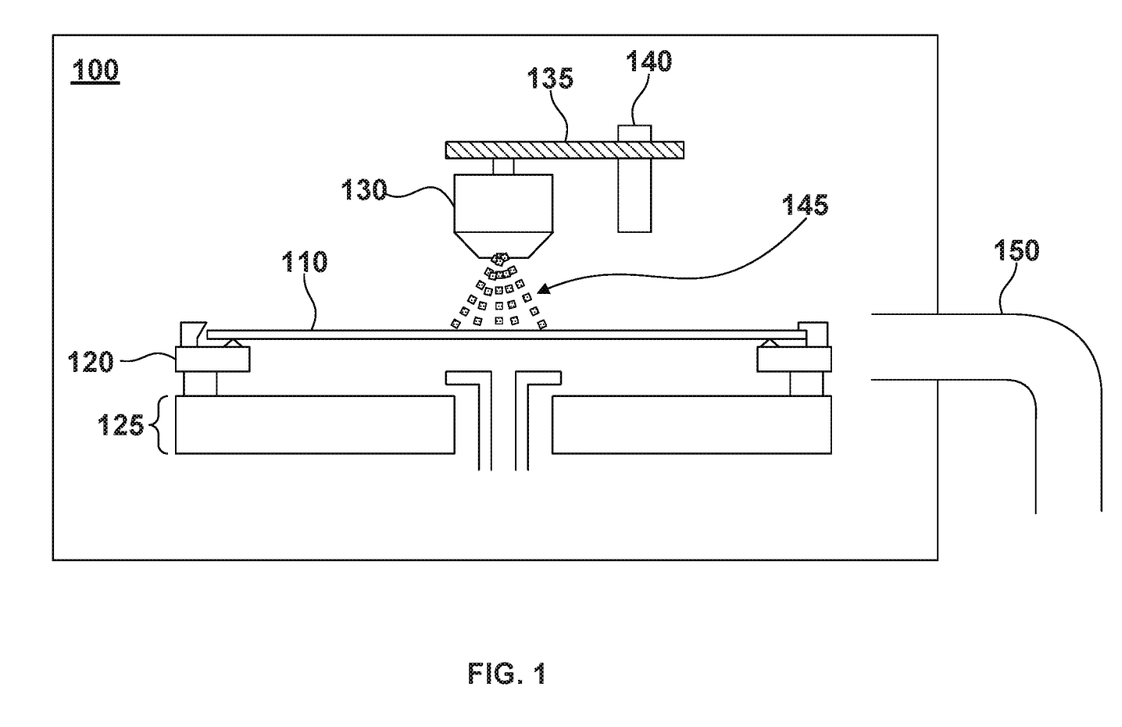
FIG. 1 is a cross-sectional view of an exemplary a single wafer clean station in a wet cleaning cluster tool, according to some embodiments.

FIG. 1 is a cross sectional view of an exemplary single-wafer wet cleaning module or cleaning station 100 on a wet cleaning cluster tool (not shown in FIG. 1 for simplicity). The wet cleaning cluster tool may include additional components required for operation. By way of example and not limitation such components may include modules (e.g., transfer modules and wet cleaning stations), robotic arms, pumps, exhaust lines, heating elements, gas and chemical delivery lines, controllers, valves, and external and internal electrical connections to other components of the cluster tool (e.g., computer units, chemical analyzers, mass flow controllers, pressure controllers, valves, and pumps). These additional components may or may not be depicted in FIG. 1; however, they are within the spirit and scope of this disclosure.

In exemplary cleaning station 100, a wafer 110 is transferred on a wafer holder 120. Wafer holder 120 is further attached to a spin base 125 of cleaning station 100. In some embodiments, wafer holder 120 can spin wafer 110 via spin base 125 during a wet cleaning or a drying process at different speeds. Cleaning station 100 further includes a spray nozzle 130 attached to a nozzle arm 135, which can pivot around a spindle 140. In some embodiments, cleaning station 100 can be equipped with more than one spray nozzle 130 depending on the design of cleaning station 100. In some embodiments, the distance between spray nozzle 130 and water 110 can be adjusted or remain fixed for the duration of the cleaning process. Further, the orientation of spray nozzle 130 with respect to a top surface of wafer 110 can also be adjusted or remain fixed, according to some embodiments. Spray nozzle 130 can dispense one or more chemical solutions in the form of a spray to the surface of wafer 110. By way of example and not limitation, nozzle 130 can be connected via one or more chemical switch boxes to external tanks filled with chemicals. The chemical switch boxes can be chemical distribution systems, where valves and chemical distribution lines are housed and chemical solutions are pre-mixed prior to be delivered to nozzle 130. The chemical switch boxes and the external tanks are not shown in FIG. 1 for simplicity. In some embodiments, spray nozzle 130 may or may not pivot around spindle 140 while a cleaning solution 145 is dispensed on water 110. At the same time, wafer 110 may or may not be rotated while a cleaning solution 145 is dispensed on its surface.

Cleaning station 100 also includes one or more drain lines 150. According to some embodiments, the "consumed" chemical solution, after it has been disposed from the wafer's surface, can be collected through the one or more drain lines 150 to a collection tank, where it can be subsequently transferred to an analyzer for analysis. By way of example and not limitation, collection of the consumed chemical solution can be performed while wafer 110 spins during the wet cleaning operation.

In some embodiments, the analyzer is an analytical tool that determines the concentration of metal ions in the collected chemical solution. By way of example and not limitation, the analytical tool can use x-ray analysis (e.g., photon interaction with matter) to determine the concentration of metal ions in the collected chemical solution. For example, the analyzer can be an x-ray fluorescence (XRF) tool, a total reflection x-ray fluorescence (TXRF) tool, an x-ray photoelectron spectroscopy (XPS) tool, a small-angle x-ray scattering (SAXS) tool, and the like. In some embodiments, and while the cleaning operation of wafer 110 in cleaning station 100 is in progress, the used chemical solution is collected and analyzed at predetermined intervals ("sampling intervals"). The time to analyze the collected chemical solution can determine the sampling intervals. For example, the faster the analysis, the shorter the sampling intervals. In some embodiments, the sampling intervals can be built in into the wet cleaning process. By way of example and not limitation, the concentration of metal ions in the collected chemical solution can be high at the beginning of the wet cleaning process and low towards the end of the wet cleaning process. In some embodiments, the concentration of metal ions in the analyzed chemical solution is an indicator of the metal contamination on the surface of wafer 110. For example, a high concentration of metal ions in the sampled chemical solution can indicate a high concentration of metal contamination on the surface of wafer 110. Conversely, a low concentration of metal ions in the sampled chemical solution can indicate a low concentration of metal contamination on the surface of wafer 110. Therefore, when the concentration of metal ions in the collected chemical solution is below an "established baseline level" (e.g., a threshold value), the wet cleaning process can be terminated. The term "established baseline level," as used herein, refers to a contamination level that has been deemed to have minimal impact on subsequent processing operations or have any appreciable impact on die yield loss. The baseline level for a wet cleaning process can be determined, for example, when the correlation between the ion contamination levels in the chemical solution and the impact to downstream processes have been established. The threshold value for a single type of metal ions (e.g., aluminum ions) a front end of the line (FEOL) wet cleaning process can be different from the threshold value in a back end of the line (BEOL) wet cleaning process. By way of example and not limitation, the aluminum ion concentration baseline level for the wet cleaning process in the FEOL can be about one order of magnitude lower than the aluminum ion concentration baseline level for a wet cleaning process in BEOL.

According to some embodiments, at the beginning of the wet cleaning operation, the concentration levels of metal ions in the chemical solution can vary from wafer to wafer due to prior processing operations (e.g., deposition, etching, planarization, cross-contamination, etc.) of the incoming wafers. However, the concentration of metal ions in the collected chemical solution at the end of the wet cleaning process can be equal or below the baseline level. By way of example and not limitation, the metal contaminants on the wafer can include copper, iron, tungsten, cobalt, titanium, tantalum, yttrium, zirconium, ruthenium, hafnium, or combinations thereof. However, the above list of metal contaminants is not exhaustive and additional metals used in semiconductor fabrication can be detected.

In some embodiments, a wet cleaning process can be a multiple step process that includes a different chemical solution for each step. By way of example and not limitation, a wet cleaning process can include at least one chemical solution capable of removing metal contaminants from the surface of the wafer. For example, chemical solutions capable of removing metal contaminants from the surface of the wafer can include a hydrochloric acid/hydrogen peroxide/deionized (DI) water (HPM) solution, a sulfuric acid/hydrogen peroxide/DI water (SPM) solution, a hydrofluoric acid/DI water (DHF) solution, an ozone solution (ozone diluted in water), or combinations thereof. Such chemical solutions may be dispensed on the wafer successively and independently from one another at different stages of the wet cleaning process. For example, an exemplary wet cleaning process can include a DHF step and an HPM step with another cleaning step in between.

By way of example and not limitation, the HPM mixture is an acidic solution capable of removing metals from the surface of the wafer. More specifically, the HPM can be a solution with high oxidation potential (e.g., higher than 1.3 V) and low pH (e.g., below about 7). Consequently, metal contaminants on the surface of the wafer can be ionized and dissolved in the HPM solution during the wet cleaning process. As a result, the "consumed" HPM solution, which is removed (e.g., drained) from the wet cleaning module after the wet cleaning process, contains a measurable concentration of metal ions originating from the wafer. Accordingly, any chemical solution capable of removing metallic contaminants from the water's surface will contain traces of metal ions or metals after its use in the wet cleaning process.

For example purposes, the wet cleaning process will be described containing at least an HPM cleaning step. Based on the disclosure herein, additional cleaning solutions capable of removing metallic or other contaminates from the surface of the wafer, as discussed above, can be used. These cleaning solutions are within the spirit and scope of this disclosure.

Figure 2:
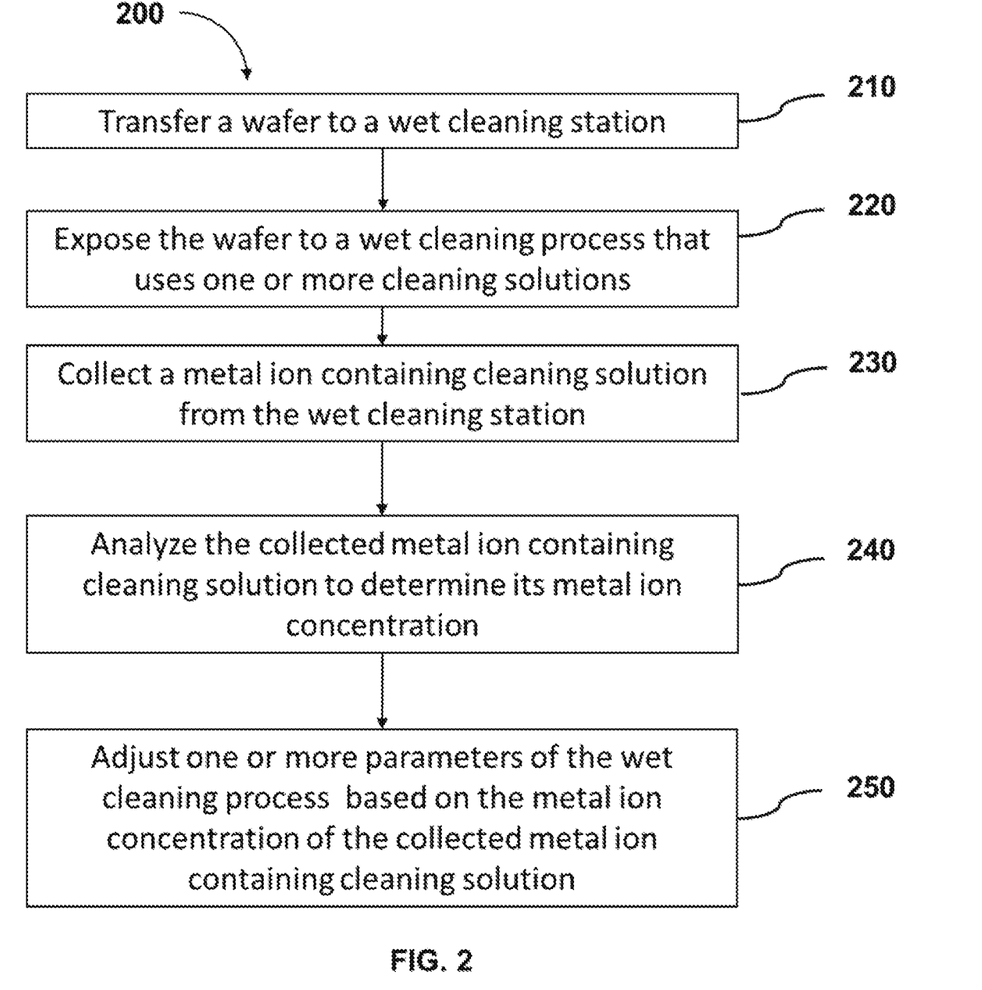
FIG. 2 is flow chart of a wet cleaning process for a wafer clean station, according to some embodiments.

FIG. 2 is a flow chart of method 200, which describes an exemplary metal contamination monitoring procedure for a wet cleaning process, according to some embodiments. By way of example and not limitation, the wet cleaning process of method 200 can be performed in cleaning station 100 shown in FIG. 1. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 2. In some implementations, one or more other operations may be performed in addition to or in place of the presently described operations. For illustrative purposes, method 200 is described with reference to the embodiments of FIGS. 1 and 3. However, method 200 is not limited to these embodiments.

For example purposes, method 200 will be described for a single-wafer wet cleaning station. Based on the disclosure herein, method 200 can be equally applied to batch wet cleaning stations that can process multiple wafers at a time. Both wet cleaning station configurations (single-wafer and batch) are within the spirit and scope of this disclosure.

Method 200 begins with operation 210, where a wafer is transferred to a wet cleaning station. For example, and referring to FIG. 3, wafer 110 can be transferred to wet cleaning station 100 via a transfer module with a robotic arm (not shown). As discussed above, wet cleaning station 100 can be a module in a wet cleaning cluster tool (not shown), which can further include additional wet cleaning stations, modules, and equipment appropriate for its operation. In some embodiments, wafer 110 includes metal contaminants on its surface due to prior processing operation(s) or handling.

In operation 220 of method 200, wafer 110 is exposed to a wet cleaning process inside wet cleaning station 100. The wet cleaning process can include one or more cleaning solutions, according to some embodiments. The one or more cleaning solutions can remove particles, organic contaminants, and metallic contaminants from a surface of wafer 110. By way of example and not limitation, in method 200, the metallic contaminants can be removed with an HPM solution, an SPM solution, or a DHF solution, any of which can be part of the wet cleaning process. In some embodiments, the wet cleaning process is a multiple step cleaning process that subjects the wafer to a series of cleaning solutions. As discussed with respect to FIG. 1, each cleaning solution 145 can be disposed on the surface of wafer 110 through spray nozzle 130. As discussed above, nozzle 130 can be connected via one or more chemical switch boxes (not shown) to external tanks (not shown) filled with pre-mixed or unmixed chemicals (e.g., hydrochloric acid, hydrogen peroxide, and/or DI water). The chemical switch boxes can be chemical distribution systems, where valves and chemical distribution lines are housed and chemical solutions can be pre-mixed prior to delivery to the wafer's surface through nozzle 130 of cleaning station 100.

The HPM solution (or any other solution capable of removing metal contaminants from the wafer) is substantially free from traces of metal ions prior to being disposed on the wafer's surface. In other words, the HPM solution, or any other solution capable of removing metal contaminants from the wafer, does not contain detectable traces of metal ions prior that come into contact with the surface of the wafer. When the HPM solution, or any other solution capable of removing metal contaminants from the wafer, comes into contact with the metal contaminated surface of the wafer, the metal contaminants on the surface of the wafer can be ionized and subsequently dissolved in the HPM solution. The ionized metal contaminants (thereafter "metal ion contaminants"), which are dissolved in the HPM solution, are subsequently removed from the surface of the wafer as the HPM solution is drained from the wet cleaning station. Consequently, the drained HPM solution is "infused" with metal ion contaminants and becomes a metal ion containing solution. Therefore, the HPM solution collected from the cleaning station can have a traceable concentration of metal ion contaminants. The term "metal ion containing," as used herein, refers to a chemical solution that has been dispensed on the wafer; it has chemically or physically interacted with the wafer's surface and—as a result of this interaction—it can contain a traceable amount of metal ion contaminants. In some embodiments, the concentration of metal ion contaminants in the drained HPM solution is indicative of the amount of metal ions removed from the wafer's surface and the amount of metal contamination on the wafer during the wet cleaning process. As the wet cleaning process progresses, the concentration of metal ions in the HPM solution decreases.

In operation 230 of method 200 of FIG. 2, the cleaning solution with the metal ion contaminants from the wet cleaning process is collected from the wet cleaning station. In some embodiments, wafer 110 may be spinning while cleaning solution 145 is being dispensed on wafer 110 via spray nozzle 130 to assist with the removal of cleaning solution 145 from the surface of the wafer.

Figure 3:
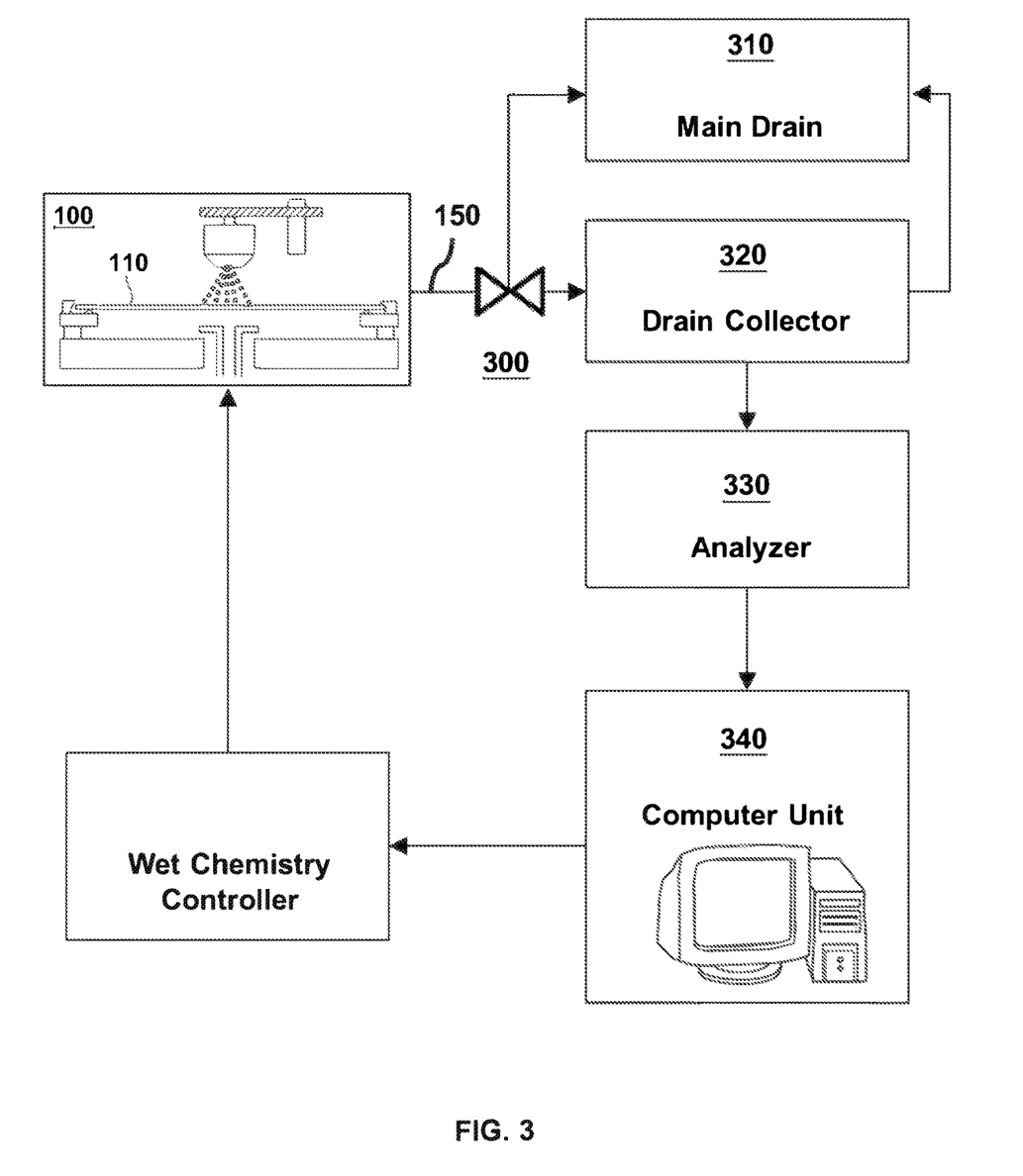
FIG. 3 is an exemplary wet cleaning system, according to some embodiments.

The cleaning solution with the metal ion contaminants 145 (e.g., metal containing HPM solution or any other solution capable of removing metal contaminants from the wafer) may be collected through the one of more drain lines 150 shown in FIG. 3, Subsequently, the metal ion containing solution can be diverted through valve 300 from main drain 310 into a drain collector 320 shown in FIG. 3. In some embodiments, drain collector 320 can collect small quantities of the cleaning solution with the metal ion contaminants. In some embodiments, drain collector 320 may collect more than one cleaning solutions from the wet cleaning process— for example, drain collector 320 can collect DHF, SPM, or other solutions used in the wet cleaning process. Uncollected quantities of the wet cleaning solutions can be diverted to main drain 310. In some embodiments, main drain 310 is a central or intermediate waste point in a fabrication facility, where used chemicals from wet cleaning cluster tools are collected and neutralized.

For example purposes, the cleaning solution with the metal ion contaminants in the wet cleaning process of method 200 will be described in the context of an HPM solution. Based on the disclosure herein, other solutions capable of removing metal contaminants from the wafer can be used. These solutions are within the spirit and scope of this disclosure.

In some embodiments, the HPM solution can be collected in predetermined intervals while the HPM solution is dispensed in wet cleaning station 100. Alternatively, the HPM solution can be collected once at the beginning of the HPM dispense step and once towards the end of the HPM dispense step. However, this is not limiting and the collection frequency of the HPM solution can be adjusted based on the analysis time required for the collected chemical solution. For example, the faster the analysis, the shorter the sampling intervals. In some embodiments, the sampling intervals can be built in into the wet cleaning process. The collected HPM solution can be stored temporarily in drain collector 320 until it can be sampled, according to some embodiments. Once the HPM solution is sampled, it can be rerouted to main drain 310 through a drain line.

In operation 240 of method 200, the cleaning solution with the metal ion contaminants (e.g., the HPM solution) from drain collector 320 is sampled and analyzed to determine its metal ion concentration. In referring to FIG. 3, an analyzer 330 can be used to determine the metal ion concentration, according to some embodiments. In some embodiments, analyzer 330 can use x-ray analysis to determine the concentration of metal ions in the collected solution. For example, analyzer 330 can be an XRF tool, an XPS tool, or another suitable tool. As discussed above, the concentration of metal ions in the HPM solution can be higher at the beginning of the HPM dispense step and lower towards the end of the HPM dispense step. Further, the concentration of metal ions in the analyzed cleaning solution can be directly proportional to the concentration of metal contaminants on the surface of wafer 110, according to some embodiments.

In some embodiments, drain collector 320 and analyzer 330 are in close proximity to cleaning station 100. For example, drain collector 320 and analyzer 320 can be positioned next to the wet cleaning cluster tool, where wet cleaning station 100 is housed. In some embodiments, drain collector 320 and analyzer 310 are stand-alone units or can be a module in the wet cleaning cluster tool. In some embodiments, drain collector 320 and analyzer 330 correspond to a single cleaning station 100. In other words, every cleaning station on the wet cleaning cluster tool has a dedicated collector and analyzer. The aforementioned configuration allows real time monitoring of the wet cleaning process. By way of example and not limitation, sampling of the HPM solution from drain collector 320 can be performed automatically through a network of pipe lines and valves operated by a control unit in analyzer 330. The network of pipe lines and valves is not shown in FIG. 3 for simplicity. In some embodiments, the wet cleaning multiple step sequence triggers the sampling of HPM solution from drain collector 320. For example, the sampling sequence can be built in the sequence (recipe) of the wet cleaning process.

In operation 250 of method 200, one or more parameters of the wet cleaning process of method 200 can be adjusted based on the measured metal ion concentration of the collected cleaning solution (e.g., in the HPM solution). In some embodiments, the metal ion concentration is compared to an established baseline level. According to some embodiments, and depending on the results of this comparison, one or more parameters of the wet cleaning process can be adjusted. By way of example and not limitation, the comparison of the analyzed data to the baseline level can be performed in a computer unit 340. In some embodiments, computer unit 340 can be part of analyzer 330. However, this is not limiting, and computer unit 340 can be a remote unit at a different location (e.g., a server). According to some embodiments, computer unit 340 can be part of a big data network system that collects and processes information from a variety of sources throughout a fabrication facility. For example, computer unit 340 can collect data from pressure sensors, analytical tools, mass flow controllers, etc. In some embodiments, computer unit 340 is configured to receive metal ion concentration data from one or more analyzers, such as analyzer 330, and compare the data to an established baseline value stored in a database or in a local storage medium. Based on the comparison, computer unit 340 can send one or more commands to cleaning station 100 to adjust one or more parameters associated with the wet cleaning process.

In some embodiments, a wet cleaning process parameter in cleaning station 100 that can be adjusted is the water content of the HPM solution e.g., the ratio of $H_2O$ to $HCl+H_2O_2$, or $H_2O:(HCl+H_2O_2)$. More specifically, if the metal ion concentration in the collected HPM solution is equal to, or greater than, the stored baseline value, computer unit 340 send a command to cleaning station 100 to decrease the water content in the HPM solution. In some embodiments, if the metal ion concentration in the collected HPM solution is lower than the stored baseline value, computer unit 340 can send a command to cleaning station 100 to increase the water content in the HPM solution for the remainder of the cleaning process—e.g., the HPM solution becomes "weaker." In some embodiment, the water content in the HPM solution can be adjusted by controlling, for example, the flow of water and/or the flow of hydrochloric acid in the HPM solution.

In some embodiments, a wet cleaning process parameter in cleaning station 100 that can be adjusted is the duration of the HPM cleaning step. More specifically, if the metal ion concentration in the collected HPM solution is equal to, or greater than, the stored baseline value, computer unit 340 can send a command to cleaning station 100 to extend the duration of the HPM cleaning step (e.g., extend the duration by 1 s, 3 s, 7 s, 10 s, 1 min, etc.). Alternatively, if the metal ion concentration in the collected HPM solution is lower than the stored baseline value, computer unit 340 can send a command to cleaning station 100 to shorten or terminate the HPM cleaning step.

According to some embodiments, another wet cleaning process parameter in cleaning station 100 that can be adjusted in response to the metal ion contamination in the HPM solution is the temperature of the HPM solution. For example, the temperature of the HPM solution dispensed on the wafer can be raised or lowered to adjust the strength of the HPM solution for the remainder of the wet cleaning step. In some embodiments, raising the temperature of the HPM solution strengthens the cleaning solution, and lowering the temperature of the HPM solution weakens the cleaning solution.

In some embodiments, multiple wet cleaning parameters in cleaning station 100 can be adjusted in response to the metal ion contamination in the HPM solution. For example, the duration of the HPM solution, the water content, the temperature of the HPM solution, or combinations thereof can be simultaneously or individually adjusted.

Even though method 200 has been described herein with a wet cleaning that includes an HPM solution, other solutions that participate in the wet cleaning process may be used with method 200 to optimize the removal of metal contaminants from the wafer. For example, if a wet cleaning process includes a DHF and an HPM step, where the DHF is dispensed before the HPM, the DHF can be collected and analyzed for metal ion contamination so that parameters of the HPM solution can be adjusted in advance of being dispensed. Such parameters may include, but are not limited to, HPM solution dispense time (e.g., duration), HPM solution water content, HPM solution temperature, or combinations thereof.

The exemplary metal contamination monitoring procedure described in method 200 is not limited to single-wafer cleaning stations (e.g., cleaning station 100). For example, the exemplary metal contamination monitoring procedure described in method 200 can be applied to wet cleaning baths that can treat batches of wafers as opposed to one wafer at a time. By way of example and not limitation, the chemical solutions from the cleaning baths can be drained, collected, and analyzed according to the metal contamination monitoring procedure of method 200.

This disclosure is directed to a wafer cleaning process in which a drained cleaning solution, which is used to remove metal contaminants from the wafer, is sampled and analyzed to determine the concentration of metal ions in the solution. The metal ion concentration in the solution is an indicator of the metal contamination on the wafer. Various parameters of the wafer cleaning process can be dynamically adjusted during the wafer cleaning process based on the concentration of metal ion contaminants in the collected cleaning solution. For example, if the measured concentration of metal ions in the solution is elevated compared to a baseline level, the duration of the wet cleaning process or the strength of the solution can be increased. On the other hand, if the measured concentration of metal ions is within the baseline level, the wafer can be dried and removed from the wet cleaning station, or the solution can be further diluted for the remainder or the wet cleaning process. The wafer cleaning method described herein can be used to reduce the cleaning process time for incoming wafers whose contamination levels are low and may require a shorter wet clean.

In some embodiments, a system includes a cleaning station configured to remove contaminants from one or more wafers via a cleaning process that includes a chemical solution; a drain collector configured to collect the chemical solution from the cleaning station; an analyzer configured to analyze the chemical solution collected in the drain collector to determine a contaminant concentration in the chemical solution; and a computer unit. The computer unit is configured to compare the contaminant concentration to a baseline value and in response to the contaminant concentration being equal to or less than the baseline value, send a first command to the cleaning station to terminate the cleaning process. Further the computer unit, in response to the contaminant concentration being greater than the baseline value, is configured to send a second command to the cleaning station to adjust one or more parameters in the cleaning process.

In some embodiments, a method for cleaning includes dispensing, in a wafer cleaning station, a chemical solution on one or more wafers; collecting the dispensed chemical solution; determining a concentration of contaminants in the chemical solution; in response to the concentration of the contaminants being greater than a baseline value, adjusting one or more parameters in the cleaning process; and in response to the concentration of the contaminants being equal to or less than the baseline value, transferring the one or more wafers out of the wafer cleaning station.

In some embodiments, a system includes a wafer cleaning station configured to perform a cleaning process on one or more wafers by dispensing a chemical solution over the one or more wafers; a collector configured to collect, from a drain line of the wafer cleaning station, the chemical solution dispensed over the one or more wafers; an analyzer configured to analyze the collected chemical solution and output a concentration of one or more metal ions dissolved in the chemical solution; and a computer unit. The computer unit is configured to compare the concentration of the one or more metal ions to corresponding one or more baseline values and in response to the concentration of the one or more metal ions being equal to or less than the one or more baseline values, send a first command to the wafer cleaning station to remove the one or more wafers from the wafer cleaning station. Further the computer unit is configured to, in response to the concentration of the one or more metal ions being greater than the baseline value, send a second command to the wafer cleaning station to adjust one or more parameters of the cleaning process.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a cleaning station configured to remove contaminants from one or more wafers via a cleaning process comprising a chemical solution;
   a drain collector configured to intermittently collect samples of the chemical solution by diverting a flow of the chemical solution from the cleaning station at sampling intervals;
   an analyzer configured to analyze the chemical solution collected in the drain collector to determine a contaminant concentration in the chemical solution; and
   a computer unit configured to:
      store a plurality of established baseline values determined based on downstream processes, wherein the plurality of established baseline values comprises a first baseline value for a front end of the line (FEOL)

wet cleaning process and a second baseline value for a back end of the line (BEOL) wet cleaning process, wherein the first baseline value is lower than the second baseline value;

compare the contaminant concentration to a baseline value of the established baseline values according to a downstream process following the cleaning process;

terminate the cleaning process performed by the cleaning station in response to the contaminant concentration being equal to or less than the baseline value; and increase a temperature of the chemical solution dispensed by the cleaning station in response to the contaminant concentration being greater than the baseline value.

2. The system of claim 1, wherein the contaminant concentration indicates an amount of metal contamination on the one or more wafers.

3. The system of claim 1, wherein the computer unit is further configured to, in response to the contaminant concentration being greater than the baseline value, change a water content in the chemical solution, increase a duration of the cleaning process, or both.

4. The system of claim 1, wherein the chemical solution comprises one or more of a hydrochloric acid/hydrogen peroxide/deionized (DI) water (HPM) solution, a sulfuric acid/hydrogen peroxide/DI water (SPM) solution, a hydrofluoric acid/DI water (DHF) solution, an ozone solution, and combinations thereof.

5. The system of claim 1, wherein the analyzer is configured to determine a contaminant concentration using x-ray analysis.

6. The system of claim 5, wherein the x-ray analysis comprises one or more of x-ray fluorescence (XRF), x-ray photoelectron spectroscopy (XPS), and small-angle x-ray scattering (SAXS).

7. A system, comprising:
a cleaning station configured to perform a cleaning process with a chemical solution on a wafer;
a drain collector configured to collect samples of the chemical solution;
an analyzer configured to analyze the samples;
a computer unit configured to:
store a plurality of baseline values, wherein the plurality of established baseline values comprises a baseline value for a front end of the line (FEOL) wet cleaning process;
compare a contaminant concentration of the samples to the plurality of baseline values; and
in response to the contaminant concentration being greater than at least one baseline value of the plurality of baseline values, increase a temperature of the chemical solution dispensed by the cleaning station.

8. The system of claim 7, wherein the computer unit is further configured to, in response to the contaminant concentration being equal to or less than the plurality of baseline values, terminate the cleaning process.

9. The system of claim 7, wherein the contaminant concentration indicates an amount of metal contaminants on the wafer.

10. The system of claim 9, wherein the metal contaminants comprise copper, iron, tungsten, cobalt, titanium, tantalum, yttrium, zirconium, ruthenium, hafnium, or combinations thereof.

11. The system of claim 7, wherein the chemical solution comprises a mixture of hydrofluoric acid and deionized water.

12. The system of claim 7, wherein, in response to the contaminant concentration being greater than the at least one baseline value, the cleaning station is further configured to adjust a duration of the cleaning process.

13. The system of claim 7, wherein the drain collector is further configured to collect samples of the chemical solution at sampling intervals.

14. A system, comprising:
a cleaning station configured to remove contamination from a wafer via a cleaning process comprising a chemical solution, wherein the cleaning station is configured to collect the chemical solution after the chemical solution has been dispensed onto the wafer;
a drain collector configured to collect a sample of the chemical solution from the cleaning station;
an analyzer configured to analyze the sample to determine a contaminant concentration in the chemical solution;
a computer unit configured to:
store, in a database of the computer, a plurality of baseline values comprising a baseline value for a back end of the line (BEOL) wet cleaning process;
compare the contaminant concentration to at least one baseline value of the plurality of baseline values; and
in response to the contaminant concentration being greater than the at least one baseline value, increase a temperature of the chemical solution.

15. The system of claim 14, further comprising a main drain configured to divert the chemical solution for neutralization.

16. The system of claim 14, wherein the computer unit is further configured to, in response to the contaminant concentration being equal to or less than the at least one baseline value, terminate the cleaning process performed by the cleaning station.

17. The system of claim 14, wherein the contaminant concentration comprises an amount of metal contaminants on the wafer.

18. The system of claim 14, wherein the chemical solution comprises a mixture of hydrofluoric acid and deionized water.

19. The system of claim 14, wherein in response to the contaminant concentration being greater than the at least one baseline value, the cleaning station is further configured to adjust a water content of the chemical solution.

20. The system of claim 14, wherein, in response to the contaminant concentration being greater than the at least one baseline value, the cleaning station is further configured to adjust a duration of the cleaning process.

* * * * *

UNITED STATES PATENT AND TRADEMARK OFFICE
CERTIFICATE OF CORRECTION

PATENT NO. : 12,162,045 B2
APPLICATION NO. : 16/521187
DATED : December 10, 2024
INVENTOR(S) : Chao et al.

Page 1 of 1

It is certified that error appears in the above-identified patent and that said Letters Patent is hereby corrected as shown below:

On the Title Page

Item (57), under "Abstract", Line 6, delete "waters;" and insert -- wafers; --, therefor.

In the Specification

In Column 1, Line 19, delete "water" and insert -- wafer --, therefor.

In Column 3, Line 33, delete "water" and insert -- wafer --, therefor.

In Column 3, Line 48, delete "water" and insert -- wafer --, therefor.

In Column 4, Line 35, delete "a" and insert -- in a --, therefor.

In Column 5, Line 18, delete "water's" and insert -- wafer's --, therefor.

In Column 6, Line 61, delete "FIG. 3," and insert -- FIG. 3. --, therefor.

Signed and Sealed this
Fourth Day of February, 2025

Coke Morgan Stewart
*Acting Director of the United States Patent and Trademark Office*